United States Patent
Kang et al.

(10) Patent No.: US 9,627,026 B1
(45) Date of Patent: Apr. 18, 2017

(54) REFRESH CONTROL DEVICE

(71) Applicant: SK hynix Inc., Icheon-si, Gyeonggi-do (KR)

(72) Inventors: Min Soo Kang, Seoul (KR); So Min Park, Yongin-si Gyeonggi-do (KR)

(73) Assignee: SK HYNIX INC., Icheon-si (KR)

( * ) Notice: Subject to any disclaimer, the term of this patent is extended or adjusted under 35 U.S.C. 154(b) by 0 days.

(21) Appl. No.: 15/206,448

(22) Filed: Jul. 11, 2016

(30) Foreign Application Priority Data

Apr. 15, 2016 (KR) .................. 10-2016-0046342

(51) Int. Cl.
*G11C 17/00* (2006.01)
*G11C 11/406* (2006.01)
*G11C 17/16* (2006.01)
*G11C 29/00* (2006.01)

(52) U.S. Cl.
CPC ............ *G11C 11/406* (2013.01); *G11C 17/16* (2013.01); *G11C 29/783* (2013.01)

(58) Field of Classification Search
CPC ...... G11C 11/406; G11C 17/16; G11C 29/783
USPC ............ 365/96, 94, 105, 114, 174, 175, 222
See application file for complete search history.

(56) References Cited

U.S. PATENT DOCUMENTS

| 8,935,467 | B2 | 1/2015 | Yu et al. |
| 9,076,549 | B2 * | 7/2015 | Kim ................. G11C 11/40618 |
| 9,153,294 | B2 | 10/2015 | Kang |

* cited by examiner

*Primary Examiner* — Fernando Hidalgo
(74) *Attorney, Agent, or Firm* — William Park & Associates Ltd.

(57) ABSTRACT

A refresh control device may include a fuse array configured to store fuse data. The refresh control device may include a refresh controller including cell arrays including unit cells. The refresh controller may be configured to store position information of a word line having weak cell characteristics based on fuse data. The refresh control device may include a comparator configured to receive data from the cell arrays of a selected cell and may be configured to compare the data to determine the presence of a weak word line to either perform or skip the refresh operation on the corresponding cell.

24 Claims, 10 Drawing Sheets

REFRESH CONTROL DEVICE

CROSS-REFERENCE TO RELATED APPLICATION

This application claims priority based upon Korean patent application No. 10-2016-0046342, filed on Apr. 15, 2016, the disclosure of which is hereby incorporated in its entirety by reference herein.

BACKGROUND

1. Technical Field

Embodiments of the present disclosure may generally relate to a refresh control device, and more particularly to a technology relating to a refresh current.

2. Related Art

In recent times, consumer demand for high-capacity dynamic random access memories (DRAMs) for use in mobile electronic appliances including smartphones or the like is rapidly increasing. Generally, data stored in memory cells of a semiconductor memory device such as DRAM may be changed by a leakage current. Therefore, a refresh operation for periodically recharging data stored in the memory cells is needed.

A memory cell of a dynamic semiconductor memory, such as a DRAM, stores data in a capacitive element. Due to the leakage of charges from the capacitive element, the memory cell must be periodically refreshed. The refresh process performs a read operation for restoring a level of charges stored in the memory cell to an original state.

Specifically, a semiconductor memory device such as Double Data Rate Synchronous DRAM (DDR SDRAM) includes a plurality of memory banks for storing data therein, and each memory bank includes tens of millions of memory cells therein. Each memory cell includes a cell capacitor and a cell transistor. The semiconductor memory device may charge or discharge the cell capacitor to store data therein.

Ideally, the charge stored in the cell capacitor must be constant in so far as an additional control signal is not used. However, the charge stored in the cell capacitor is unavoidably changed due to a difference in voltage between the cell capacitor and the peripheral circuit.

In other words, charges may leak outside under the condition that the cell capacitor is charged with electricity, or charges may be received under the condition that the cell capacitor is discharged. Changing the amount of charges stored in the cell capacitor may indicate that data stored in the cell capacitor is changed, resulting in loss of the stored data. The semiconductor memory device may perform the refresh operation to prevent the stored data from being lost.

Different types of refresh methods have been developed over time. Generally, the auto refresh method is configured to use a refresh timer located outside of a memory chip, such that the memory chip can perform the refresh operation in response to a periodic refresh command from a controller.

The self refresh method is configured to use a refresh timer located inside the memory chip, such that all the memory chips are configured to request a refresh start command from the controller.

SUMMARY

In accordance with an embodiment of the present disclosure, a refresh control device may include a fuse array configured to store fuse data. The refresh control device may include a refresh controller including cell arrays including unit cells. The refresh controller may be configured to store position information of a word line having weak cell characteristics based on fuse data. The refresh control device may include a comparator configured to receive data from the cell arrays of a selected cell and may be configured to compare the data to determine the presence of a weak word line to either perform or skip the refresh operation on the corresponding cell.

DETAILED DESCRIPTION

Reference will now be made in detail to the embodiments of the present disclosure, examples of which are illustrated in the accompanying drawings. Wherever possible, the same reference numbers will be used throughout the drawings to refer to the same or like parts. The logic levels of the signals may be different from or the opposite of those described. For example, a signal described as having a logic "high" level may alternatively have a logic "low" level, and a signal described as having a logic "low" level may alternatively have a logic "high" level."

Various embodiments of the present disclosure may be directed to providing a refresh control device that substantially obviates one or more problems due to limitations and disadvantages of the related art.

An embodiment of the present disclosure may relate to a refresh control device for reducing a refresh current by controlling a refresh period in different ways according to refresh characteristics of respective cells.

Figure 1:
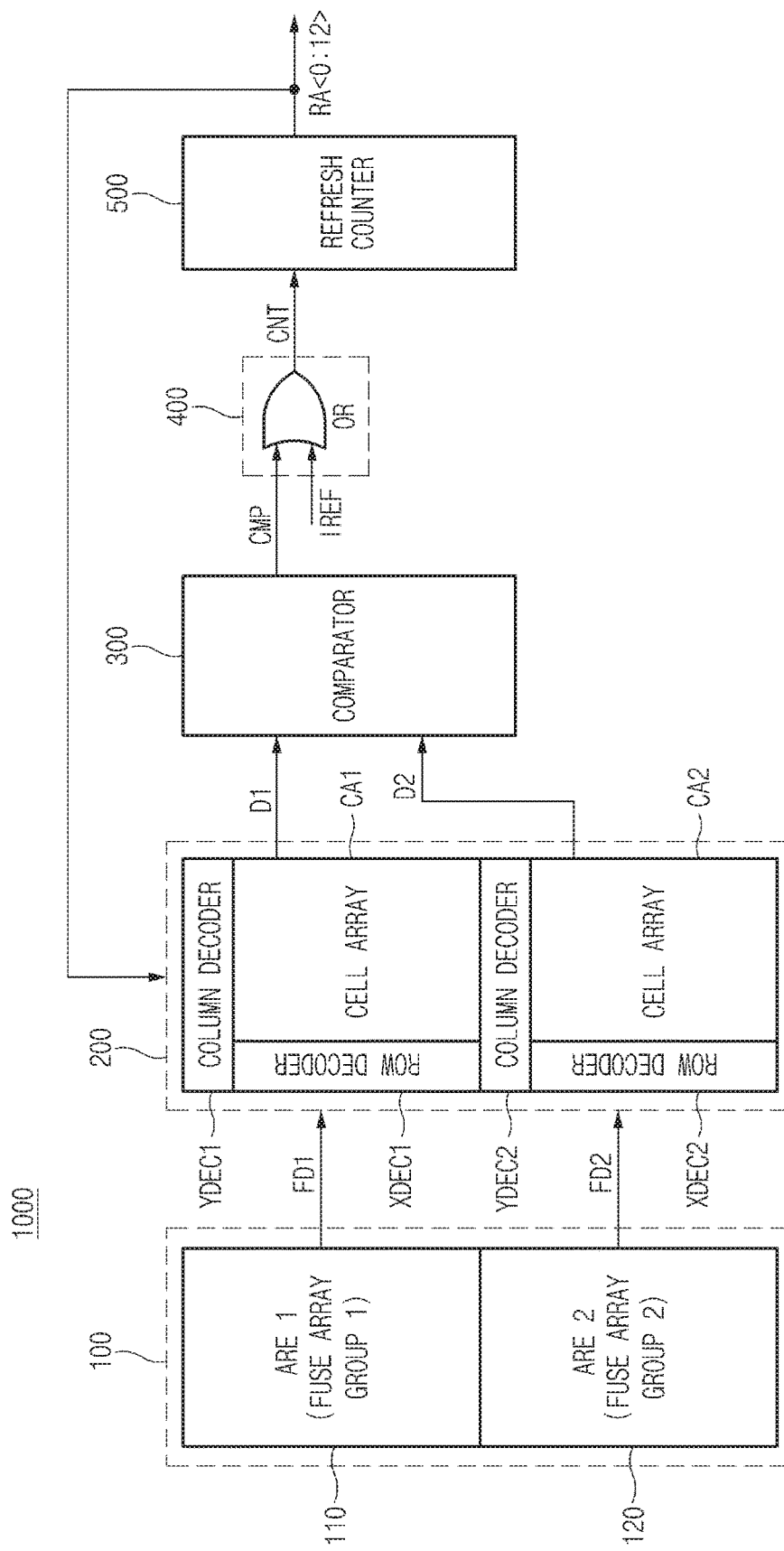
FIG. 1 is a block diagram illustrating a representation of an example of a refresh control device according to an embodiment of the present disclosure.

FIG. 1 is a block diagram illustrating a representation of an example of a refresh control device according to an embodiment of the present disclosure.

Referring to FIG. 1, the refresh control device 1000 may include a fuse array 100, a refresh controller 200, a comparator 300, a combination circuit 400, and a refresh counter 500. The refresh controller 200 may include cell arrays (CA1, CA2), row decoders (XDEC1, XDEC2), and column decoders (YDEC1, YDEC2).

The fuse array 100 may store cell characteristic information corresponding to a data retention time as fuse data. The fuse array 100 may include a fuse array group 110 and a fuse array group 120.

Fuse data corresponding to the cell characteristic information may be prestored in the fuse array group 110 and the fuse array group 120 according to fuse cutting. For example, it may be possible to obtain information regarding a cell having weak characteristics through wafer testing, and it may also be possible to store information of a weak cell through the fuse array group 110 and the fuse array group 120.

Each fuse array groups 110 and 120 may include an Array of E-Fuse (ARE) in which unit fuse cells are arranged in row and column directions. The fuse array group 110 and the fuse array group 120 may include the same number of unit fuse cells.

The fuse array group 110 may output fuse data FD1 stored in a fuse to the row decoder XDEC1 during a boot-up operation. The fuse array group 120 may output fuse data FD2 stored in a fuse to the row decoder XDEC2 during a boot-up operation.

For example, it may be assumed that the number of refresh execution units is set to 8K. As a result, the fuse array 100 may have a predetermined size corresponding to a multiple of refresh execution times. That is, the fuse array 100 may include the fuse array group 110 having 8K refresh units and the fuse array group 120 having 8K refresh units, such that the fuse array 100 may have a total of 16K refresh units.

In accordance with an embodiment, information regarding the fuse array group 110 configured to store information of a weak cell may be mapped to the refresh controller 200 formed in a cell shape, such that the mapped result is then stored. Therefore, the refresh control device according to an embodiment may greatly reduce the number of fuses as compared to a general refresh control device, and there is no limitation in the number of additional rupture times of the fuse contained in the fuse array group 110.

Since it may not be necessary to sequentially rupture addresses according to an embodiment, redundancy limitation is no longer required for the repair operation, such that a repair operation can be flexibly controlled.

The refresh controller 200 may store weak cell information in response to fuse data FD1 or FD2, and may control the refresh operation of the cell array CA1 or CA2 in response to a refresh address RA (i.e., RA<0:12>).

The row decoder XDEC1 may decode the refresh address RA and the fuse data FD1, and may thus select a row line of the cell array CA1. The row decoder XDEC2 may select a row line of the cell array CA2 by decoding the refresh address RA and the fuse data FD2. In this case, the refresh address RA may indicate address information of a row line (i.e., a word line) to be refreshed.

The column decoder YDEC1 may select a column line of the cell array CA1 in response to the refresh address RA and the fuse data FD1. The column decoder YDEC2 may select a column line of the cell array CA2 in response to the refresh address RA and the fuse data FD2.

In addition, each of the cell arrays (CA1, CA2) of the refresh controller 200 may include a plurality of unit cells arranged in row and column directions. Each of the cell arrays (CA1, CA2) may include a plurality of unit cells, and the refresh operation of each memory cell may be performed according to output signals of the row decoders (XDEC1, XDEC2) and the column decoders (YDEC1, YDEC2).

The refresh controller 200 may store position information of a weak word line having poor cell characteristics in response to the fuse data (FD1, FD2). That is, the fuse data (FD1, FD2) may be respectively transmitted to the cell arrays (CA1, CA2) during the boot-up operation, such that the fuse data (FD1, FD2) may be stored in unit cells located at the corresponding positions of the fuse array 100.

The cell array CA1 may output data D1 including weak word line information of the selected cell to the comparator 300 in response to the refresh address RA. In this case, the cell array CA1 may include a plurality of unit cells, and the data D1 stored in the plurality of unit cells may be sequentially output to the comparator 300.

The cell array CA2 may output data D2 including weak word line information of the selected cell to the comparator 300 in response to the refresh address RA. The cell array CA2 may include a plurality of unit cells, and data D2 stored in the plurality of unit cells may be sequentially output to the comparator 300.

In this case, data D1 and data D2 may correspond to 1-bit data, and may be any one of data "0" and data "1". For example, assuming that each of data D1 and data D2 corresponds to data "1", the presence of a weak word line is decided such that the corresponding cell is refreshed. For example, assuming that each of data D1 and data D2 corresponds to "0", the presence of a normal word line is decided and the corresponding cell is not refreshed, such that such cell refreshing is skipped.

If the cell characteristic information is stored only using the fuse array 100, fuse accessing is needed whenever the refresh operation is carried out. As a result, an additional storage circuit is needed in consideration of fuse reliability. However, assuming that the storage circuit is formed in a latch shape, a separate storage circuit for storing addresses of the weak cell is needed such that the region of a latch circuit may be increased in size.

The auto refresh operation may reduce the refresh period of all cells to make a short refresh period, such that it can compensate for the refresh retention time. However, the cell having a sufficiently long data retention time is also controlled according to a short refresh period, resulting in efficiency reduction of a refresh current.

However, the storage circuit for storing weak cell information may be formed to include the cell arrays (CA1, CA2), and may be formed in a peripheral circuit region of a memory device.

In this case, additional processing is not performed at the outside of a semiconductor device, and the refresh period may be controlled in different ways according to respective cells in the memory device. That is, a good cell having superior refresh characteristics and a bad cell having poor refresh characteristics are distinguished from each other according to a data retention time of each cell, resulting in reduction of the refresh current.

In accordance with an embodiment, weak cell information may be mapped to the cell arrays (CA1, CA2) in response to word line units (e.g., 8K) to be refreshed. Therefore, the cell arrays (CA1, CA2) may include word line position information regarding the weak cell without change. Therefore, the storage circuit storing an additional address is no longer required, such that the region of the weak cell storage circuit may also be reduced in size.

For example, the fuse latch circuit corresponding to dozens of bits (e.g., 12 bits) is needed when a general refresh control device stores a fail address of 1 bit. In contrast, an embodiment may store a weak cell by mapping address information according to the 8K units to be refreshed, such that only the fuse latch of 1 bit is needed. Position information of the weak cell is mapped such that a logic for comparing or operating an address of the weak cell is no longer required.

The comparator 300 may compare bits of data D1 with bits of data D2, and may output a comparison signal CMP according to the result of comparison. That is, the comparator 300 may compare bits of data D1 with bits of data D2, and may output the comparison signal CMP as data "0" or "1".

The combination circuit may output a counting signal CNT by combining the comparison signal CMP with a refresh control signal IREF. In this case, the refresh control signal IREF may be a self-refresh signal which is generated in a shape of periodic pulses in response to a refresh command to control the self-refresh operation.

If at least one of the comparison signal CMP and the refresh control signal IREF is activated, the combination circuit 400 may activate the counting signal CNT. For example, the combination circuit 400 may include an OR gate for performing a logic OR operation between the comparison signal CMP and the refresh control signal IREF.

The refresh counter 500 may count the counting signal CNT, and output the refresh address RA to the cell arrays (CA1, CA2). For example, assuming that the refresh operation is performed in units of 8K, the refresh address RA may be set to 13 refresh addresses RA<0:12> as illustrated in an embodiment of FIG. 1.

That is, the refresh counter 500 may sequentially count the refresh addresses RA for accessing the cell in which the refresh operation is performed whenever the refresh command is generated. Therefore, the cell arrays (CA1, CA2) accessed by the refresh address RA may be sequentially refreshed.

Figure 2:
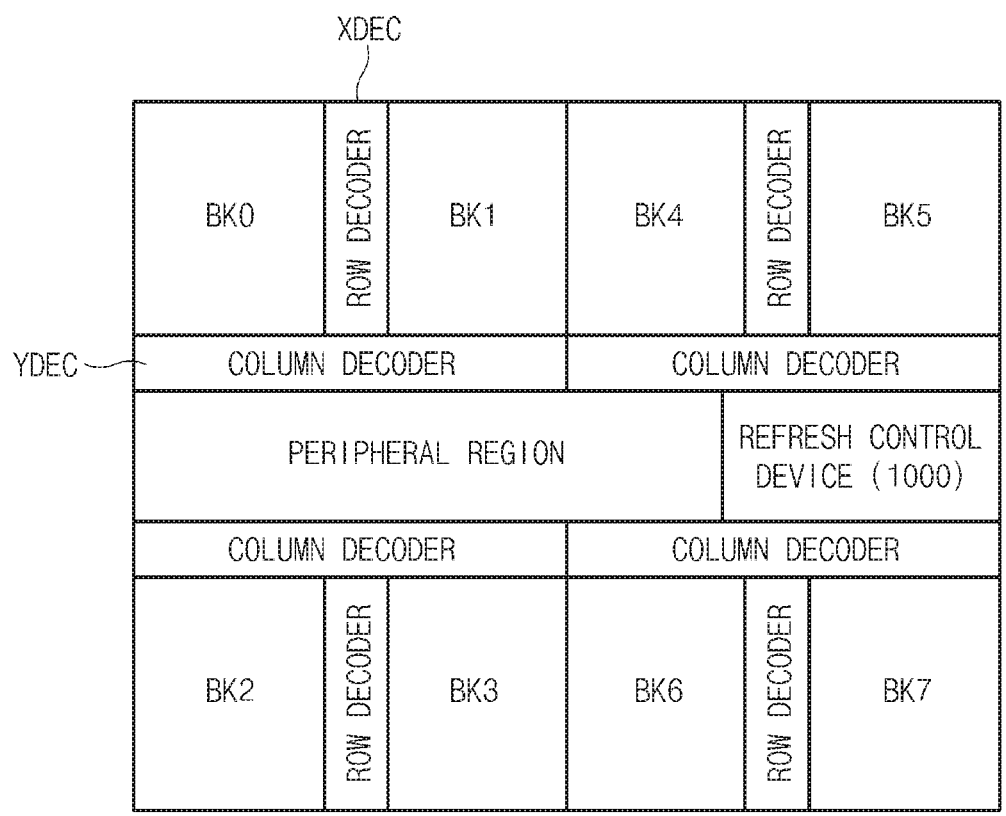
FIG. 2 is a conceptual diagram illustrating a representation of an example of a semiconductor device including the refresh control device illustrated in FIG. 1.

FIG. 2 is a conceptual diagram illustrating a representation of an example of a semiconductor device including the refresh control device 1000 illustrated in FIG. 1.

Referring to FIG. 2, the semiconductor device according to an embodiment may include a plurality of banks BK0~BK7, a plurality of row decoders XDEC, and a plurality of column decoders YDEC.

The refresh control device 1000 may include a fuse array 100, a refresh controller 200, a comparator 300, a combination circuit 400, and a refresh counter 500 as illustrated in FIG. 1. The refresh control device 1000 may be located in a peripheral region of the semiconductor device.

As described above, weak cell information is stored in the semiconductor device. In this case, an external controller or the like need not be controlled, and the refresh period of a normal cell and the refresh period of a weak cell may be controlled in different ways according to only the refresh command.

A semiconductor substrate region constructing the memory device may be classified into a core region centering around memory cells for storing data and a peripheral region in which input/output (I/O) lines and I/O devices are generally arranged.

In order to transmit data from the core region to the peripheral region, a relatively long global I/O line may be arranged. A write driver for amplifying data applied to the core region, an I/O sense amplifier for amplifying output data of the core region, and an address/command processing circuit may be located at the end of the core region of the global I/O line. The refresh control device 1000 according to an embodiment may be located at the address/command processing circuit of the peripheral region of the semiconductor device.

The semiconductor memory device should periodically perform the refresh operation due to cell leakage components. For example, 8K refresh actions may be carried out for a predetermined time of 64 ms.

Although the refresh operation is performed according to predefined specification outwardly, the amount of cell leakage is gradually increasing in proportion to the increasing technology shrink of semiconductor devices. At least one refresh operation may be performed by one external command externally, and this scheme is hereinafter referred to as the auto refresh operation. The auto refresh operation may compensate for the cell leakage by applying a short refresh period to all the cells.

However, in the case of using the above-mentioned scheme, the cell having a sufficiently long data retention time has a shortened refresh period, resulting in an increased refresh current. Therefore, a good cell having superior refresh characteristics and a bad cell having poor refresh characteristics are distinguished from each other according to a data retention time of each cell, and different refresh periods are allocated to respective cells, resulting in increased current efficiency.

Figure 3:
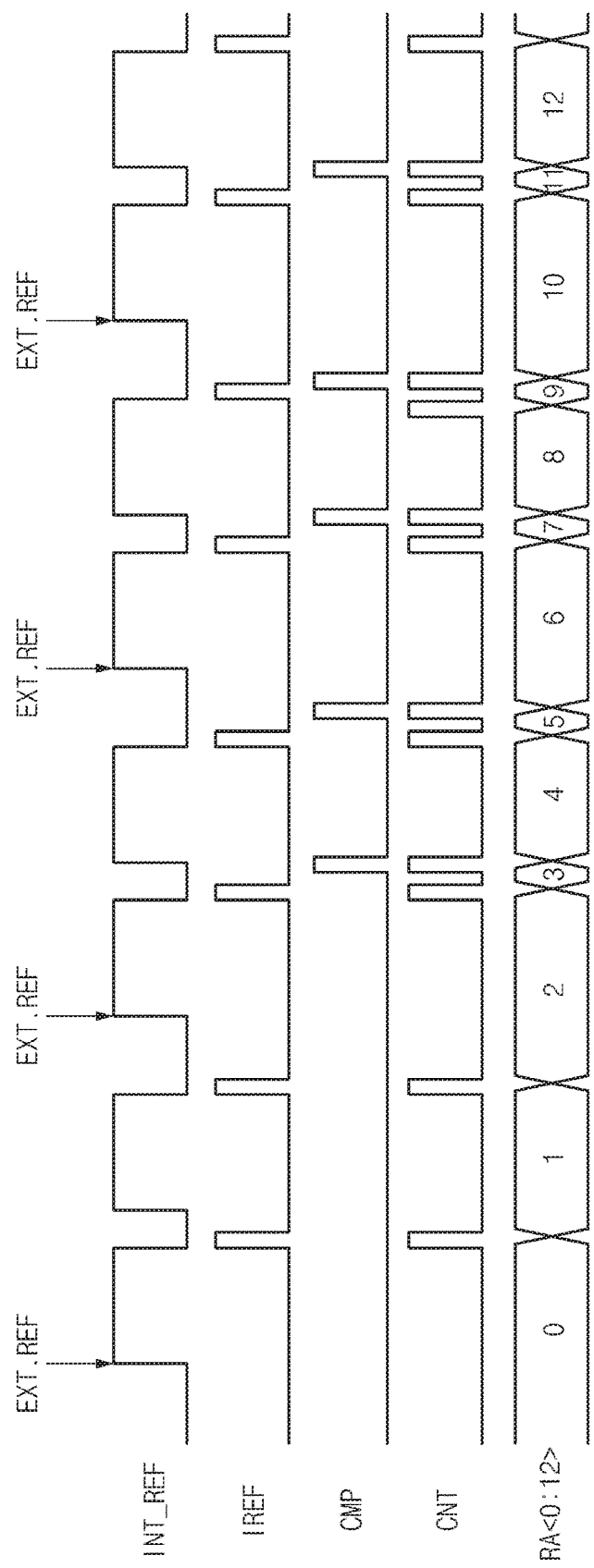
FIG. 3 is a timing diagram illustrating a representation of an example of the operation of FIG. 1.

FIG. 3 is a timing diagram illustrating a representation of an example of the operations of FIG. 1.

Referring to FIG. 3, an internal refresh command signal INT_REF may be received in response to an external refresh command signal EXT_REF. A refresh control signal IREF may be activated in units of a refresh cycle in synchronization with the falling edge of the internal refresh command signal INT_REF.

That is, assuming that the internal refresh command signal INT_REF is activated, the refresh control signal IREF is activated at intervals of a predetermined period according to a specification of the semiconductor device, such that the word line WL of each memory cell is activated. In this case, the refresh control signal IREF may be the self refresh signal internally generated in response to the internal refresh command signal INT_REF.

The refresh control signal IREF formed in a pulse shape may be applied to the combination circuit 400. The comparator 300 may compare data (D1, D2) received from the cell arrays (CA1, CA2) with each other, and may output the comparison signal CMP to the combination circuit 400 according to the result of comparison.

For example, assuming that data D1 or data D2 is set to "0", the comparator 300 may determine the presence of a normal cell, such that it may output the comparison signal CMP at a logic low level. For example, assuming that data D1 or data D2 is set to "1", the comparator 300 may determine the presence of a weak cell to be refreshed, such that it may output the comparison signal CMP at a logic high level.

If the comparison signal received from the comparator 300 is enabled to a high level or if the refresh control signal IREF is enabled to a high level, the combination circuit 400 may activate the counting signal at a high level.

The refresh counter 500 may generate the refresh address RA by counting the counting signal CNT. For example, the refresh counter 500 may sequentially output the refresh address RA by counting the number of counting signals CNT, each of which transitions to a high-level pulse signal.

For example, the refresh counter 500 may perform a normal refresh operation for the cell array CA1 or the other cell array CA2 by performing a periodic counting operation upon receiving the refresh control signal IREF. The refresh counter 500 may increase the count value at a specific time at which the comparison signal CMP transitions to a logic high level, such that the additional refresh operation of weak cells of either the cell array CA1 or the cell array CA2 may be carried out.

The cell of the semiconductor device may retain cell data through the periodic refresh operation. With the development of technology and the shrinkage of the semiconductor device, storage capacitance of the cell is reduced and it becomes difficult to guarantee self refresh characteristics. Accordingly, the refresh period of the cell having weak characteristics is shortened in a manner that refreshing of the cell is frequently carried out, such that memory characteristics can be guaranteed.

Figure 4:
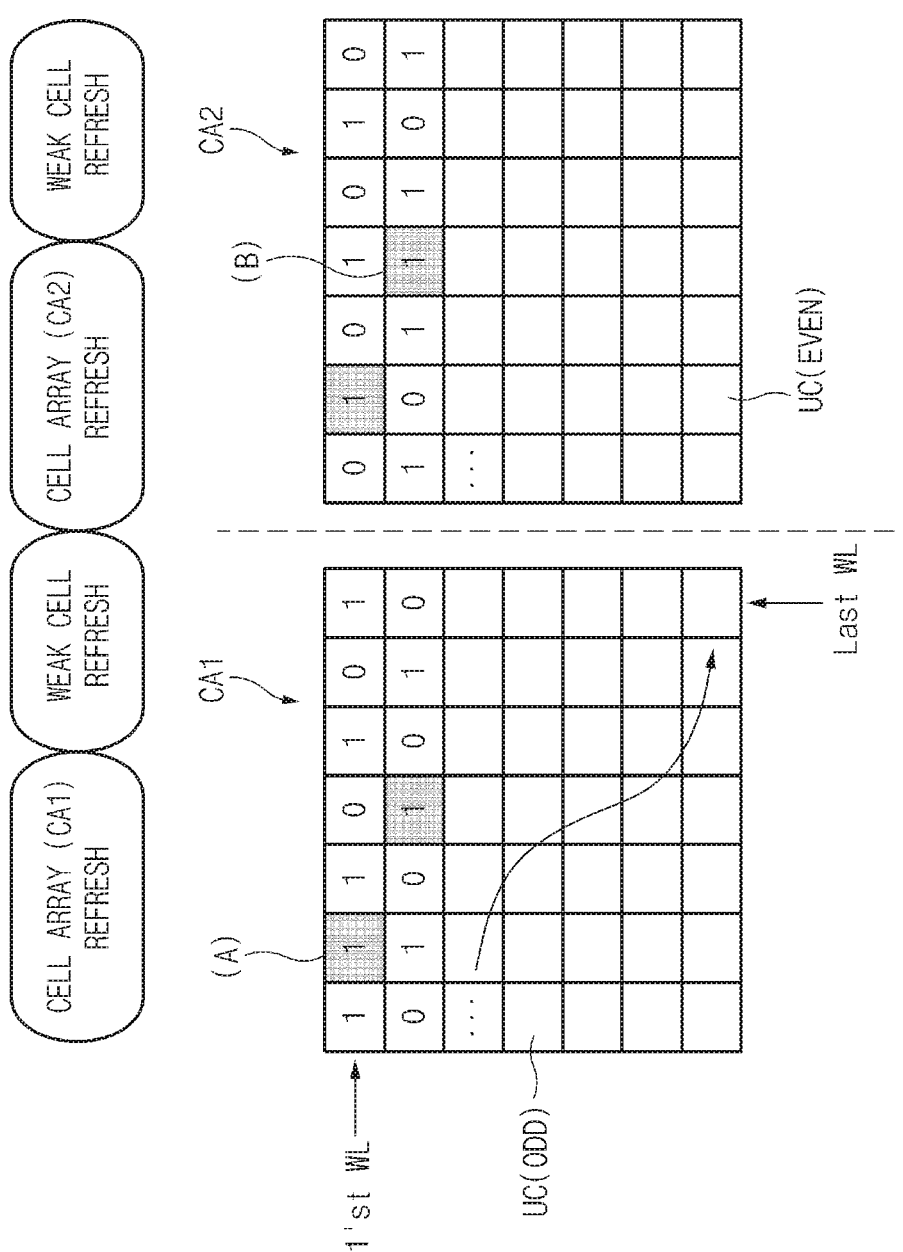
FIG. 4 is a conceptual diagram illustrating a representation of an example of a refresh controller illustrated in FIG. 1.

FIG. 4 is a conceptual diagram illustrating cell arrays (CA1, CA2) illustrated in FIG. 1.

Referring to FIG. 4, each of the cell arrays (CA1, CA2) may include a plurality of unit cells (UCs) arranged in row and column directions. Each cell array (CA1, CA2) may store cell characteristic information corresponding to a data retention time in the unit cells (UCs). That is, each cell array (CA1, CA2) may store position information of the normal word line indicating characteristics of the normal cell or position information of the weak word line indicating characteristics of the weak cell in the unit cells (UCs).

The first cell array CA1 from among the cell arrays (CA1, CA2) may store characteristic information of the weak cell in unit cells (UC(ODD)) of odd lines. The second cell array CA2 may store characteristic information of the weak cell in unit cells (UC(EVEN)) of even lines.

In the cell arrays (CA1, CA2), weak cell information may be sequentially stored in unit cells ranging from a unit cell corresponding to a first word line ($1^{st}$ WL) to a unit cell corresponding to the last word line (WL). That is, all data of weak cells may be alternately and sequentially stored in odd-lined unit cells of the cell array CA1 and even-lined unit cells of the cell array CA2.

For example, it may be assumed that the cell array CA1 includes a total of 8K unit cells (UCs). Data D1 may be stored in the odd unit cells UC(ODD) from among the total of 8K unit cells (UC). The odd unit cells UC(ODD), each of which stores data "1" therein, correspond to weak cells, such that the refresh operation of the weak cells is carried out.

In the cell array CA1, data "1" may be stored in the odd unit cells UC(ODD), and data "0" may be stored in the remaining even unit cells. However, assuming that data "1" is stored as illustrated in (A) even though the even unit cells are used, the corresponding cell is determined to be a weak cell, such that the additional refresh operation for the corresponding cell is performed.

Therefore, although the cell array CA1 includes a total of 8K refresh units, a total of (4K+α) refresh operations including not only the refresh operation for odd unit cells UC(ODD) but also additional weak cell refresh operations may be carried out in the cell array CA2.

In this way, it may be assumed that the cell array CA2 includes a total of 8K unit cells (UC). Data D2 may be stored in even unit cells UC (EVEN) from among the 8K unit cells (UC). The even unit cells UC(EVEN), each of which stores data "1", may correspond to weak cells, such that the refresh operation of such weak cells may be carried out.

In the cell array CA1, data "1" may be stored in even unit cells UC(EVEN), and data "0" may be stored in the remaining odd unit cells. However, assuming that data "1" is stored as illustrated in (B) even though the odd unit cells are used, the corresponding cell is determined to be a weak cell, such that the additional refresh operation for the corresponding cell is performed.

Therefore, although the cell array CA2 includes a total of 8K refresh units, a total of (4K+α) refresh operations including not only the refresh operation for odd unit cells UC(EVEN) but also additional weak cell refresh operations may be carried out in the cell array CA2.

In other words, after the cell array CA1 is refreshed, the weak cell refresh operation is performed once more. Thereafter, after the cell array CA2 is refreshed, the weak cell refresh operation is performed once more.

Here, only one normal refresh operation is performed in each of the cell array CA1 and the cell array CA2. In addition, only one refresh operation is performed in each of all unit cells, each of which stores data "1", located at the same positions of the cell array CA1 and the other cell array CA2, the number of refresh operations to be performed in each unit cell is two times the number of refresh operations to be performed in each normal cell.

During the refresh operation, the word line is enabled (or activated) at least once within a retention time of each cell contained in a memory cell array such that data can be sensed and amplified. In this case, the retention time may indicate a specific time at which certain data is written in a cell and the data stored in the cell can be maintained without being refreshed.

The refresh modes are classified into an auto refresh mode and a self refresh mode. In the auto refresh mode, commands (/RAS, /CAS) are periodically activated during a normal operation, an internal address is generated, and the refresh operation is carried out. In the self refresh mode, a clock enable signal is enabled when a normal operation is not performed, an internal command is generated, and the operation corresponding to the command is performed. After reception of the command, the address is generated from the refresh counter 500, such that the auto refresh mode and the self refresh mode are performed, and the address is sequentially increased whenever the memory cell receives the address.

Figure 5:
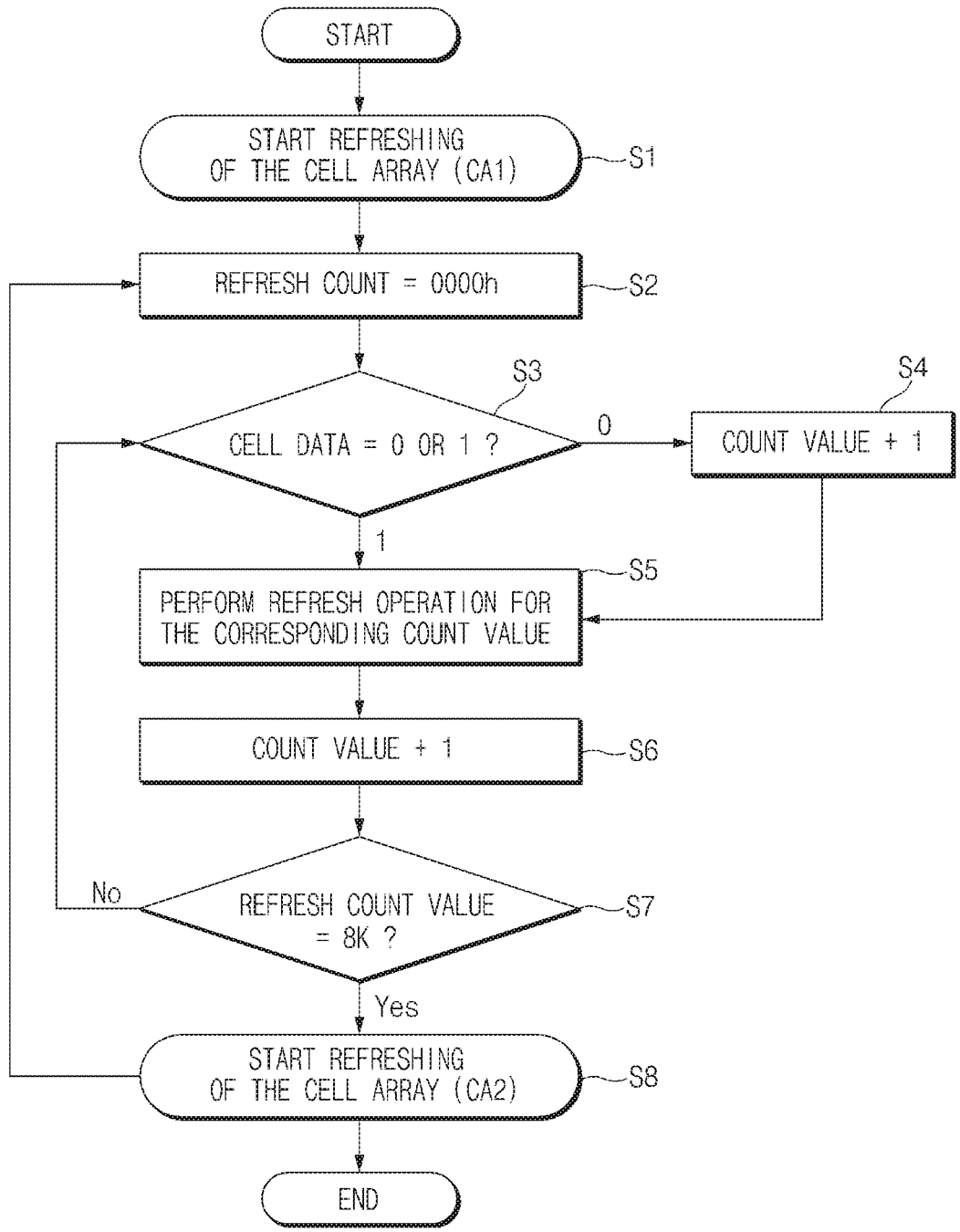
FIG. 5 is a flowchart illustrating a representation of an example of the operation of FIG. 1.

FIG. 5 is a flowchart illustrating a representation of an example of the operation of FIG. 1.

Referring to FIG. 5, the refresh operation for the cell array CA1 first starts in step S1. The refresh counter 500 may perform the refresh count operation in step S2. For example, the counting operation is continuously performed until the count value of the refresh counter 500 reaches "0000h".

Thereafter, it is determined whether cell data D1 of the cell array CA1 is set to data "1" or data "0" in step S3. That is, it is determined whether a currently selected X-th unit cell is a normal cell or a weak cell.

Assuming that cell data D1 of the cell array CA1 is identical to data "0", the count value of the refresh counter 500 may increase by one in step S4. That is, assuming that cell data D1 is identical to data "0", the presence of normal data is decided, such that the cell corresponding to the normal data is not refreshed. In addition, the count value of the refresh counter 500 is increased such that the next address may then be refreshed.

In contrast, assuming that data D1 of the cell array CA1 is identical to data "1", the cell corresponding to the count value of the refresh counter 500 is refreshed in step S5. That is, assuming that cell data D1 is identical to data "1", the presence of weak data is decided, such that the cell corresponding to the normal data is refreshed. In addition, the count value of the refresh counter 500 is increased by one in step S6.

Subsequently, it is determined whether the count value of the refresh counter 500 is identical to a predetermined count value (e.g., 8K). Although an embodiment has disclosed, for example, that the self refresh unit of the semiconductor device is set to 8K, the scope or spirit of the embodiments are not limited thereto, and the self refresh unit may also be set to another number as necessary.

If the count value of the refresh counter 500 reaches a predetermined count value, the refresh operation of the cell array CA2 is performed in step S8. If the count value of the refresh counter 500 does not reach a predetermined count value, the value of cell data D1 of the cell array CA1 is performed again.

If information of the weak address storing weak cell information is implemented through the latch circuit, the number of bits to be relieved must be predetermined and then stored. However, fuse cutting information of the fuse array 100 in the cell arrays (CA1, CA2) is decided to determine whether a target cell is a weak cell or a normal cell, such that the number of weak cells to be relieved is not limited thereto.

Figure 6:
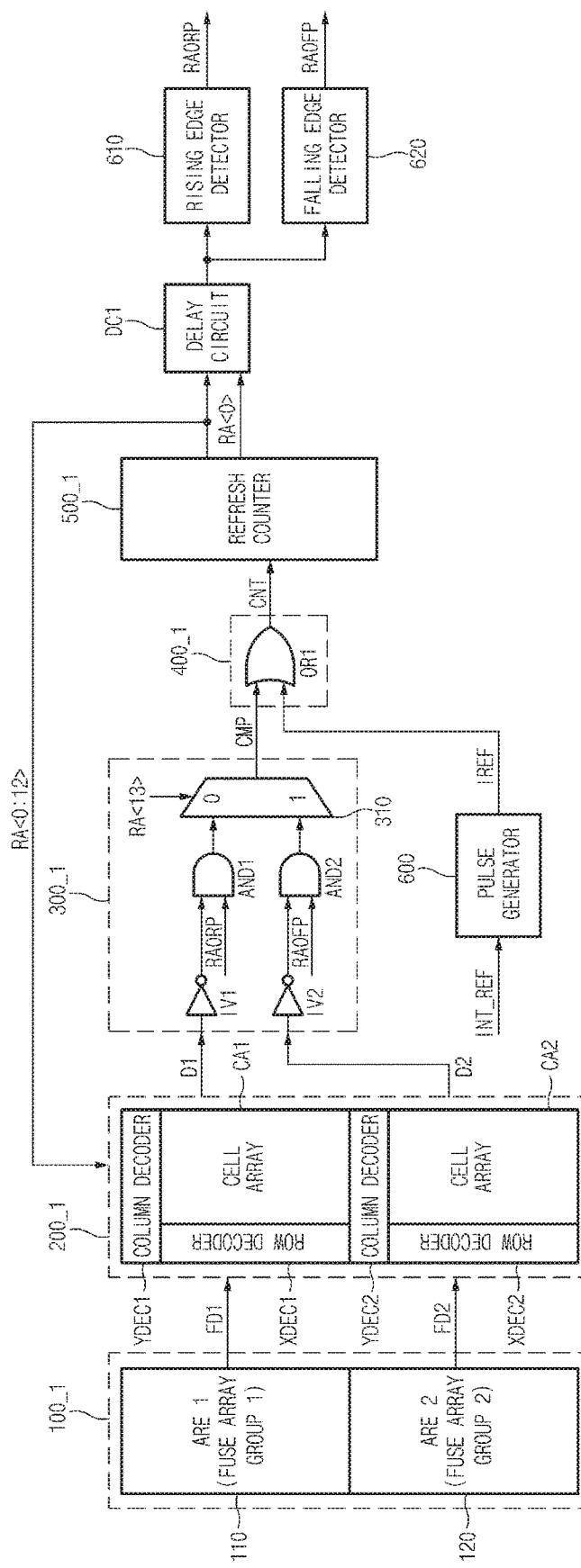
FIG. 6 is a block diagram illustrating a representation of an example of a refresh control device according to an embodiment of the present disclosure.

FIG. 6 is a block diagram illustrating a representation of an example of a refresh control device according to an embodiment of the present disclosure.

Referring to FIG. 6, the refresh control device may include a fuse array (100_1), a refresh controller (200_1), a comparator (300_1), a combination circuit (400_1), a refresh counter (500_1), a delay circuit DC1, a pulse generator 600, a rising edge detector 610, and a falling edge detector 620.

The fuse array (100_1) may store cell characteristic information corresponding to a data retention time as fuse data. The fuse array (100_1) may include a fuse array group 110 and a fuse array group 120.

Fuse data corresponding to the cell characteristic information may be prestored in each of the fuse array group 110 and the fuse array group 120 according to fuse cutting information. For example, information of the weak cell having weak characteristics may be acquired through wafer testing, and it may be possible to store the weak cell information through fuse cutting of the fuse array group 110 and the fuse array group 120.

Each of the fuse array group 110 and the fuse array group 120 may include an Array E-Fuse (ARE) in which unit fuse cells are arranged in row and column directions. Each of the fuse array group 110 and the fuse array group 120 may include the same number of unit fuse cells.

The fuse array group 110 may output fuse data FD1 stored in the fuse to the row decoder XDEC1 during the boot-up operation. The fuse array group 120 may output fuse data FD2 stored in the fuse to the row decoder XDEC2 during the boot-up operation.

For example, it is assumed that the number of refresh execution units is set to 8K. As a result, the fuse array (100_1) may have a predetermined size corresponding to a multiple of the number of refresh execution units. That is, the fuse array (100_1) may include the fuse array group 110 having 8K refresh units and the fuse array group 120 having 8K refresh units, such that the fuse array (100_1) may have a total of 16K refresh units.

The refresh controller (200_1) may store weak cell information in response to fuse data (FD1, FD2), and the refresh operation of the cell arrays (CA1, CA2) may be controlled in response to the refresh address RA. The refresh controller (200_1) may include cell arrays (CA1, CA2), row decoders (XDEC1, XDEC2), and column decoders (YDEC1, YDEC2).

The row decoder XDEC1 may select a row line of the cell array CA1 by decoding the refresh address RA and the fuse data FD1. The row decoder XDEC2 may select a row line of the cell array CA2 by decoding the refresh address RA and the fuse data FD2.

The column decoder YDEC1 may select a column line of the cell array CA1 in response to the refresh address RA and the fuse data FD1. The column decoder YDEC2 may select a column line of the cell array CA2 in response to the refresh address RA and the fuse data FD2.

In addition, the cell arrays (CA1, CA2) of the refresh controller (200_1) may include a plurality of unit cells arranged in row and column directions. The cell arrays (CA1, CA2) may include a plurality of unit cells, and the refresh operation of each memory cell may be carried out according to the output signals of the row decoders (XDEC1, XDEC2) and the column decoders (YDEC1, YDEC2).

The refresh controller (200_1) may store position information of the word line having weak cell characteristics in response to fuse data (FD1, FD2). That is, during the boot-up operation, fuse data (FD1, FD2) may be transferred to the cell arrays (CA1, CA2), and may be respectively stored in unit cells located at the corresponding positions in the fuse array (100_1).

In addition, the cell array CA1 may output data D1 including weak word line information of the selected cell to the comparator (300_1) in response to the refresh address RA. In this case, the cell array CA1 may include a plurality of unit cells, and may sequentially output data D1 stored in the plurality of unit cells to the comparator (300_1).

The cell array CA2 may output data D2 including weak word line information of the selected cell to the comparator (300_1) in response to the refresh address RA. In this case, the cell array CA2 may include a plurality of unit cells, and may sequentially output data D2 stored in the plurality of unit cells to the comparator (300_1).

In this case, data D1 or data D2 may correspond to bit data "1", and may be any one of data "0" and data "1". For example, assuming that each of data D1 and data D2 corresponds to data "1", the presence of a weak word line is decided such that the refresh operation of the corresponding cell is carried out. For example, assuming that each of data D1 and data D2 corresponds to data "0", the presence of a normal word line is decided and the corresponding cell is not refreshed, such that such cell refreshing is skipped.

The storage circuit for storing weak cell information according to an embodiment may be formed to include the cell arrays (CA1, CA2), and may be formed in a peripheral circuit region of the memory device.

The comparator (300_1) may compare data D1 with the rising pulse signal RA0RP or may compare data D2 with the falling pulse signal RA0FP, such that it may output the comparison signal CMP according to the result of the comparison. That is, the comparator (300_1) may compare bits of data D1 with bits of data D2, such that data "0" or data "1" may be output as the comparison signal CMP according to the result of the comparison.

The comparator (300_1) may include inverters (IV1, IV2), AND gates (AND1, AND2), and a selection circuit 310. In an embodiment, the comparator (300_1) may include logic gates for performing logic operations, for example, an AND operation.

The AND gate AND1 may perform a logic AND operation between the rising pulse signal RA0RP and the data D1 inverted by the inverter IV1. The AND gate AND2 may perform a logic AND operation between the falling pulse signal RA0FP and the data D2 inverted by the inverter IV2.

The selection circuit 310 may select any one of the output signal of the AND gate (AND1) and the output signal of the other AND gate (AND2) upon receiving the refresh address RA<13>, and may then output the comparison signal CMP. For example, assuming that the refresh address RA<13> is at a low level, the selection circuit 310 may output the output signal of the AND gate (AND1). Assuming that the refresh address RA<13> is at a high level, the selection circuit 310 may output the output signal of the AND gate (AND2). The selection circuit 310 may include a multiplexer (MUX).

The combination circuit (400_1) may output the counting signal CNT by combining the comparison signal CMP with the refresh control signal IREF. In this case, the refresh control signal IREF may be a self refresh signal which is generated in a shape of periodic pulses in response to a refresh command to control the self refresh operation. The pulse generator 600 may detect the edge (e.g., the falling edge) of the internal refresh command signal (INT_REF), and may thus output a refresh control signal IREF.

If at least one of the comparison signal CMP and the refresh control signal IREF is activated, the combination circuit (400_1) may activate the counting signal CNT. For example, the combination circuit (400_1) may include a logic circuit for performing an OR operation, for example, an OR gate for performing a logic OR operation (OR1) between the comparison signal CMP and the refresh control signal IREF.

The refresh counter (500_1) may count the counting signal CNT, and output the refresh address RA to the cell arrays (CA1, CA2). For example, assuming that the refresh operation is performed in units of 8K, the refresh address RA may be set to 13 refresh addresses RA<0:12> as illustrated in an embodiment of FIG. 6. The refresh address RA<0> from among the refresh addresses RA<0:12> may be output to the delay circuit DC1.

The refresh counter (500_1) may sequentially count the refresh addresses RA for accessing the cell in which the refresh operation is performed whenever the refresh command is generated. Therefore, the cell arrays (CA1, CA2) accessed by the refresh address RA may be sequentially refreshed.

The delay circuit DC1 may delay the refresh address RA<0> for a predetermined time, and output the delayed result. The rising edge detector 610 may detect the rising edge from the output signal of the delay circuit DC1, and may thus generate the rising pulse signal RA0RP. The falling edge detector 620 may detect the falling edge from the output signal of the delay circuit DC1, and may thus generate the falling pulse signal RA0FP.

Figure 7:
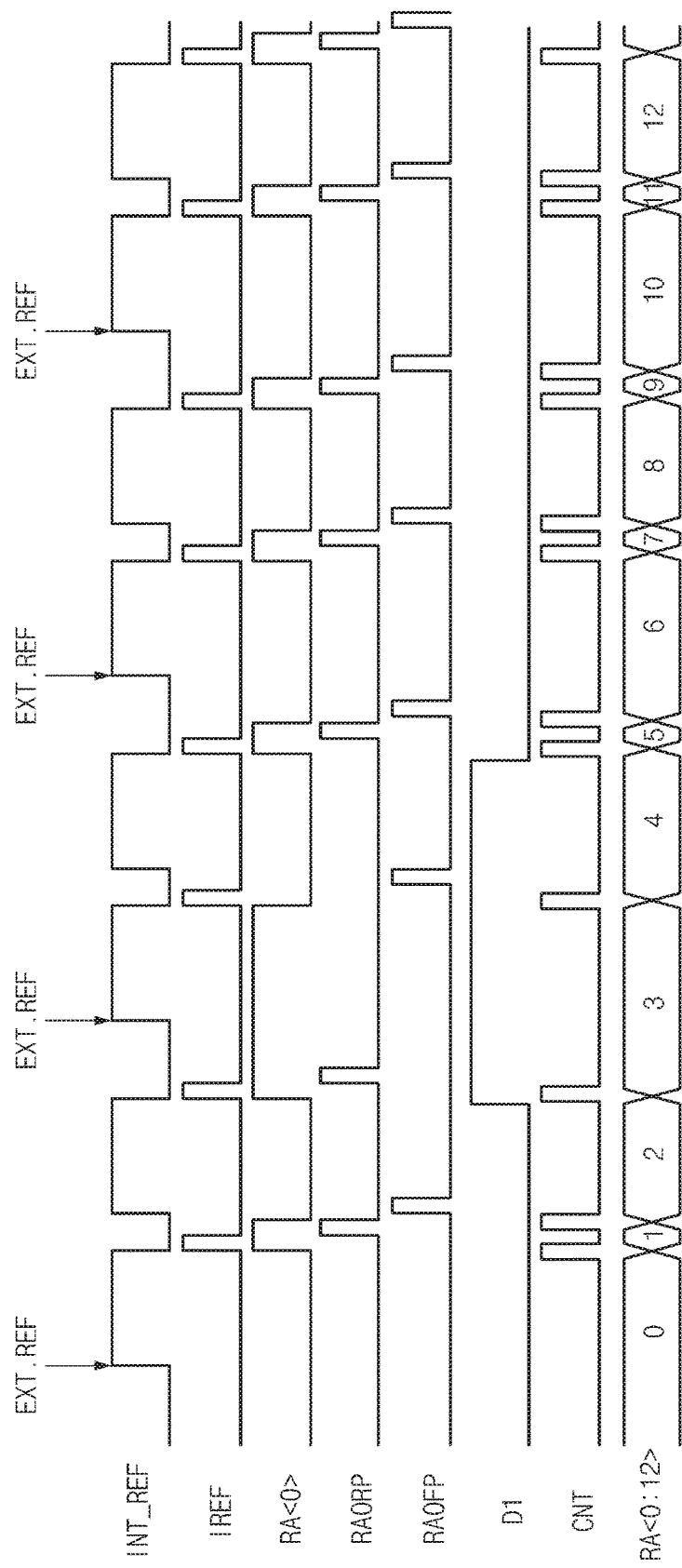
FIG. 7 is a timing diagram illustrating a representation of an example of the operation of FIG. 6.

FIG. 7 is a timing diagram illustrating a representation of an example of the operation of FIG. 6.

Referring to FIG. 7, an internal refresh command signal INT_REF may be received in response to an external refresh command signal EXT_REF. A refresh control signal IREF may be activated in units of a refresh cycle in synchronization with the falling edge of the internal refresh command signal INT_REF.

That is, assuming that the internal refresh command signal INT_REF is activated, the refresh control signal IREF is activated at intervals of a predetermined period according to specification of the semiconductor device, such that the word line WL of each memory cell is activated.

The refresh control signal IREF formed in a pulse shape may be applied to the combination circuit (400_1). The comparator (300_1) may compare data D1 received from the cell array CA1 with the rising pulse signal RA0RP, and may output the comparison signal CMP to the combination circuit (400_1) according to the result of comparison. The comparator (300_1) may compare data D2 received from the cell array CA21 with the falling pulse signal RA0FP, and may output the comparison signal CMP to the combination circuit (400_1) according to the result of comparison.

In this case, the rising edge detector 610 may detect the rising edge of the refresh address RA<0>, and may thus generate the rising pulse signal RA0RP. The falling edge detector 620 may detect the falling edge of the refresh address RA<0>, and may thus generate the falling pulse signal RA0FP. During a predetermined period in which the refresh address RA<0> remains at a high level, the falling pulse signal RA0RP is not detected.

If the comparison signal received from the comparator (300_1) is enabled to a high level or if the refresh control signal IREF is enabled to a high level, the combination circuit (400_1) may activate the counting signal at a high level.

The refresh counter (500_1) may generate the refresh address RA<0> by counting the counting signal CNT. For example, the refresh counter (500_1) may sequentially output the refresh addresses RA<0:12> by counting the number of counting signals CNT, each of which transitions to a high-level pulse signal.

That is, the refresh counter (500_1) may perform a normal refresh operation for the cell array CA1 or the other cell array CA2 by performing the periodic counting operation upon receiving the refresh control signal IREF. The refresh counter (500_1) may increase the count value at a specific time at which the comparison signal CMP transitions to a logic high level, such that the additional refresh operation of weak cells of either the cell array CA1 or the cell array CA2 may be carried out.

Figure 8:
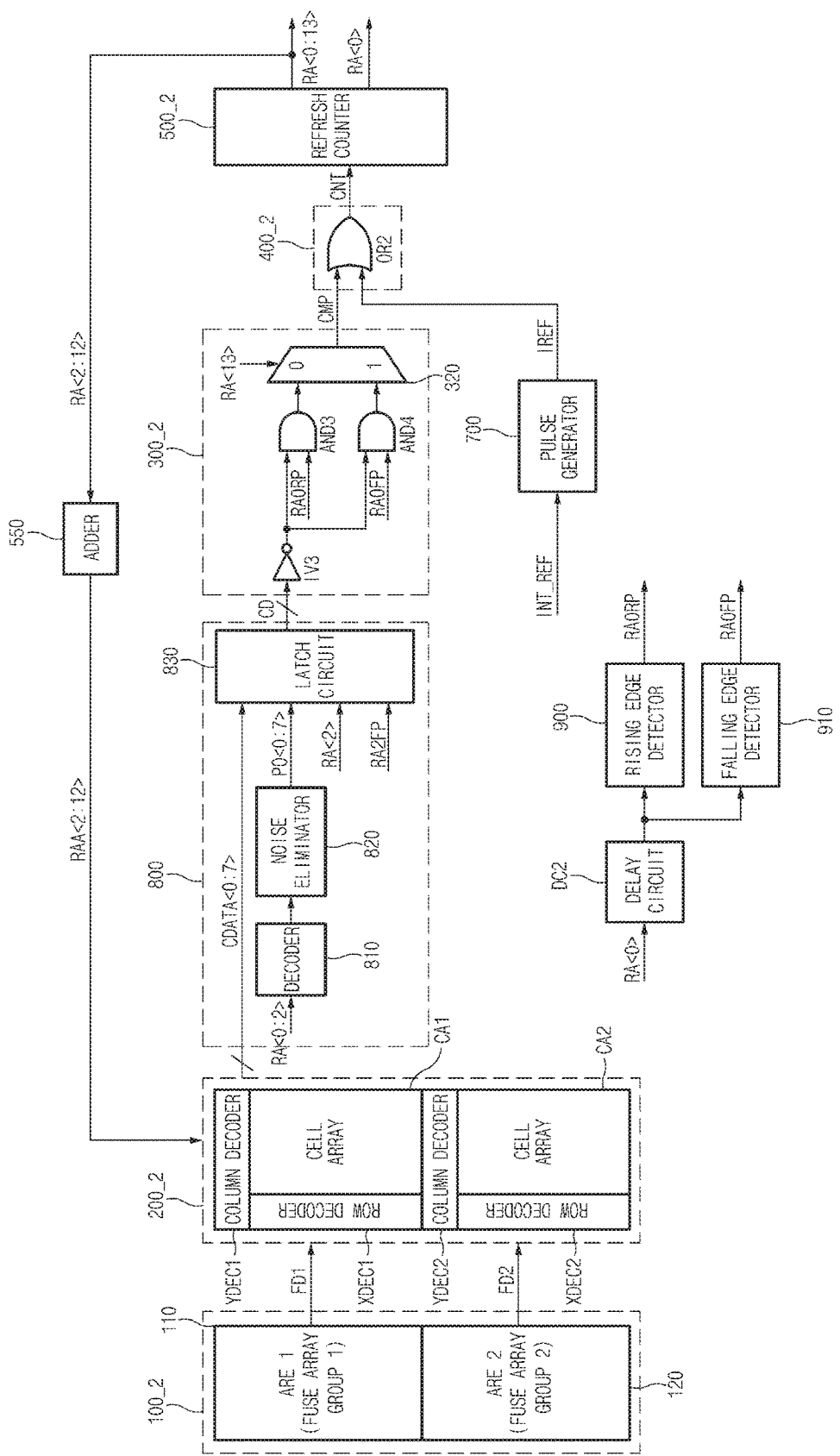
FIG. 8 is a block diagram illustrating a representation of an example of a refresh control device according to an embodiment of the present disclosure.

FIG. 8 is a block diagram illustrating a representation of an example of a refresh control device according to an embodiment of the present disclosure.

Referring to FIG. 8, the refresh control device may include a fuse array (100_2), a refresh controller (200_2), a data controller 800, a comparator (300_2), a combination circuit (400_2), a refresh counter (500_2), an adder 550, a delay circuit DC2, a pulse generator 700, a rising edge detector 900, and a falling edge detector 910.

The fuse array (100_2) may store cell characteristic information corresponding to a data retention time as fuse data. The fuse array (100_2) may include a fuse array group 110 and a fuse array group 120.

Fuse data corresponding to the cell characteristic information may be prestored in each of the fuse array group 110 and the fuse array group 120 according to fuse cutting information. For example, information of the weak cell having weak characteristics may be acquired through wafer testing, and it may be possible to store the weak cell information through fuse cutting of the fuse array group 110 and the fuse array group 120.

Each of the fuse array group 110 and the fuse array group 120 may include an Array E-Fuse (ARE) in which unit fuse cells are arranged in row and column directions. Each of the fuse array group 110 and the fuse array group 120 may include the same number of unit fuse cells.

The fuse array group 110 may output fuse data FD1 stored in the fuse to the row decoder XDEC1 during the boot-up operation. The fuse array group 120 may output fuse data FD2 stored in the fuse to the row decoder XDEC2 during the boot-up operation.

For example, it is assumed that the number of refresh execution units is set to 8K. As a result, the fuse array (100_2) may have a predetermined size corresponding to a multiple of the number of refresh execution units. That is, the fuse array (100_2) may include the fuse array group 110 having 8K refresh units and the fuse array group 120 having 8K refresh units, such that the fuse array (100_2) may have a total of 16K refresh units.

The refresh controller (200_2) may store weak cell information in response to fuse data (FD1, FD2), and the refresh operation of the cell arrays (CA1, CA2) may be controlled in response to the refresh address RA. The refresh controller (200_2) may include cell arrays (CA1, CA2), row decoders (XDEC1, XDEC2), and column decoders (YDEC1, YDEC2).

The row decoder XDEC1 may select a row line of the cell array CA1 by decoding the refresh address RA and the fuse data FD1. The row decoder XDEC2 may select a row line of the cell array CA2 by decoding the refresh address RA and the fuse data FD2.

The column decoder YDEC1 may select a column line of the cell array CA1 in response to the refresh address RA and the fuse data FD1. The column decoder YDEC2 may select a column line of the cell array CA2 in response to the refresh address RA and the fuse data FD2.

The cell arrays (CA1, CA2) of the refresh controller (200_2) may include a plurality of unit cells arranged in row and column directions. The cell arrays (CA1, CA2) may include a plurality of unit cells, and the refresh operation of each memory cell may be carried out according to the output signals of the row decoders (XDEC1, XDEC2) and the column decoders (YDEC1, YDEC2).

The refresh controller (200_2) may store position information of the weak word line having weak cell characteristics in response to fuse data (FD1, FD2). That is, during the boot-up operation, fuse data (FD1, FD2) may be transferred to the cell arrays (CA1, CA2), and may be respectively stored in unit cells located at the corresponding positions in the fuse array (100_2).

The refresh controller (200_2) may output cell data CDATA<0:7> including weak word line information of the selected cell to the data controller 800 in response to the refresh address RA. In this case, the refresh controller (200_2) may include a plurality of unit cells, and may sequentially plural cell data CDATA<0:7> stored in the plurality of unit cells to the data controller 800.

However, the storage circuit for storing weak cell information may be formed to include the cell arrays (CA1, CA2), and may be formed in a peripheral circuit region of the memory device.

The data controller 800 may receive plural cell data CDATA<0:7> (e.g., 8 data) from the refresh controller (200_2), and may sequentially output the cell data CD. That is, after the data controller 800 simultaneously receive a plurality of addresses to be refreshed in a subsequent process, the data controller 800 may sequentially output the cell data to be refreshed.

The data controller 800 may include a decoder 810, a noise eliminator 820, and a latch circuit 830. The decoder 810 may decode the refresh addresses RA<0:2>, and may thus output the decoded refresh addresses RA<0:2> to the noise eliminator 820. The noise eliminator 820 may remove glitches from the decoding signal received from the decoder 810, and may output the output signals PO<0:7>.

The latch circuit 830 may receive the plurality of cell data CDATA<0:7>, the refresh address RA<2>, the output signals PO<0:7>, and the pulse signal RA2FP, and may then sequentially output the cell data CD. The latch circuit 830 may latch plural cell data CDATA<0:7> in response to the refresh address RA<2>. The latch circuit 830 may synchronize input data in response to the pulse signal RA2FP such that the input data can be arranged. The latch circuit 830 may sequentially output the latched data as the cell data CD in response to the output signals PO<0:7>.

The comparator (300_2) may compare the cell data CD and the rising pulse signal RA0RP with each other, or may compare the cell data CD and the falling pulse signal RA0FP with each other, thereby outputting the comparison signal CMP. The comparator (300_2) may include an inverter IV13, AND gates (AND3, AND4), and the selection circuit 320. In an embodiment, the comparator (300_2) may include logic gates for performing logic operations, for example, an AND operation.

In this case, the AND gate (AND3) may perform a logic AND operation between the rising pulse signal RA0RP and the cell data CD inverted by the inverter IV3. The AND gate (AND4) may perform a logic AND operation between the falling pulse signal RA0FP and the cell data CD inverted by the inverter IV3.

The selection circuit 320 may output the comparison signal CMP by selecting any one of the output signal of the AND gate (AND3) and the output signal of the AND gate (AND4) upon receiving the refresh address RA<13>. For example, assuming that the refresh address RA<13> is at a low level, the selection circuit 320 may select the output signal of the AND gate (AND3). Assuming that the refresh address RA<13> is at a high level, the selection circuit 320 may select the output signal of the AND gate (AND4). The selection circuit 320 may include a multiplexer (MUX).

The combination circuit (400_2) may output the counting signal CNT by combining the comparison signal CMP with the refresh control signal IREF. In this case, the refresh control signal IREF may be a self refresh signal which is generated in a shape of periodic pulses in response to a refresh command to control the self refresh operation. The pulse generator 700 may detect the falling edge of the internal refresh command signal (INT_REF), and may thus output the refresh control signal IREF.

If at least one of the comparison signal CMP and the refresh control signal IREF is activated, the combination circuit (400_2) may activate the counting signal CNT. For example, the combination circuit (400_2) may include a logic circuit for performing an OR operation, for example, an OR gate for performing a logic OR operation (OR1) between the comparison signal CMP and the refresh control signal IREF.

The refresh counter (500_2) may count the counting signal CNT, and thus generate the refresh addresses RA<0:13>. For example, according to an embodiment of FIG. 8, the refresh address RA may be set to 14 refresh addresses RA<0:13> according to the refresh units. The refresh address RA<0> from among the refresh addresses RA<0:13> may be output to the delay circuit DC2. The refresh counter (500_2) may output the refresh addresses RA<2:12> to the adder 550.

The adder 550 may add "+1" to the refresh addresses RA<2:12> such that information regarding the addresses RA<2:12> to be refreshed in a subsequent process may be output to the cell arrays (CA1, CA2). In other words, the refresh counter (500_1) may sequentially count the refresh address RA for accessing the cell in which the refresh operation is performed whenever the refresh command is generated. Therefore, the cell arrays (CA1, CA2) accessed by the refresh address RA may be sequentially refreshed.

The delay circuit DC2 may delay the refresh address RA<0> for a predetermined time, and may thus output the delayed result. The rising edge detector 900 may detect the rising edge from the output signal of the delay circuit DC2, and may thus generate the rising pulse signal RA0RP. The falling edge detector 910 may detect the falling edge from the output signal of the delay circuit DC2, and may thus generate the falling pulse signal RA0FP.

Figure 9:
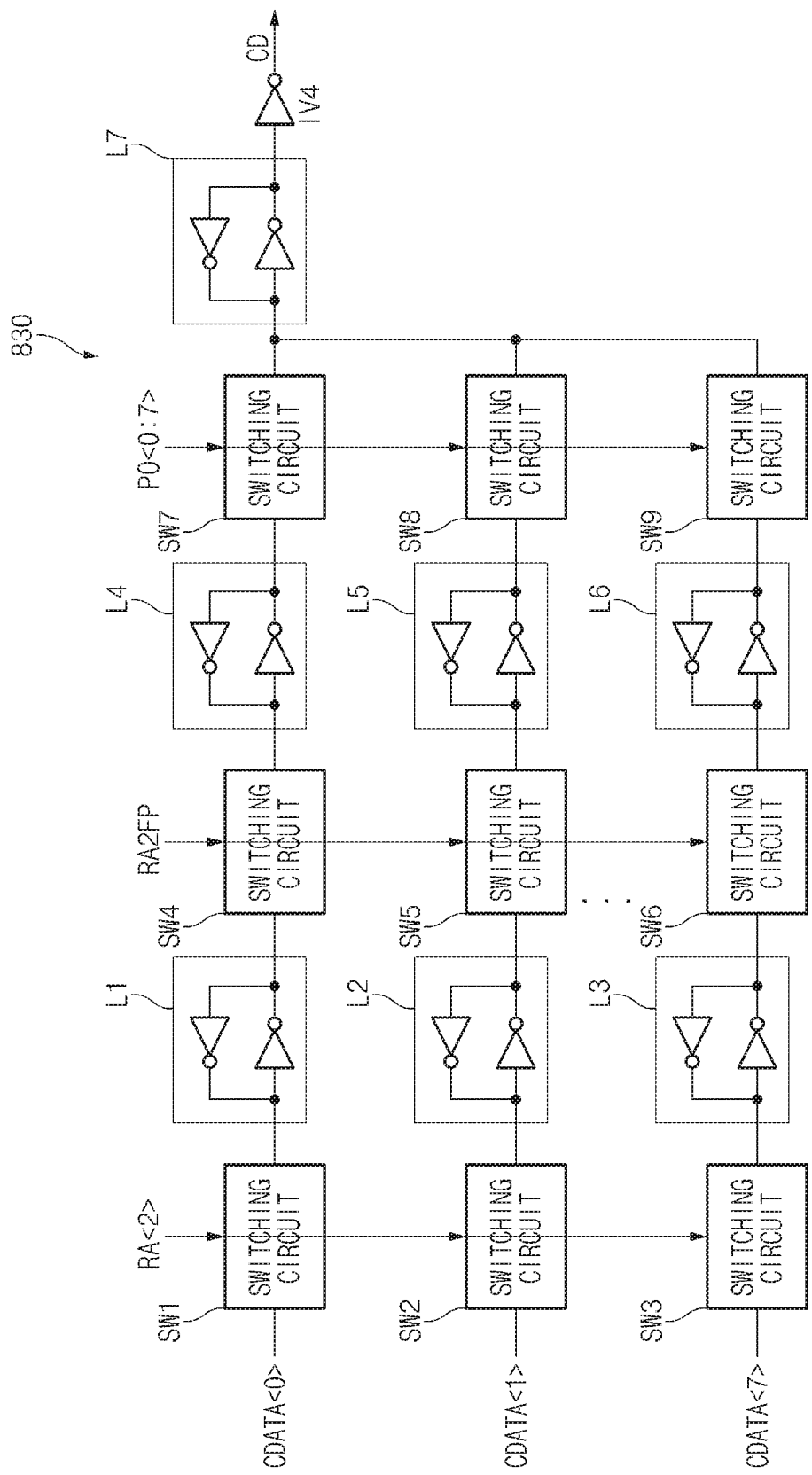
FIG. 9 is a detailed circuit diagram illustrating a representation of an example of a latch circuit illustrated in FIG. 8.

FIG. 9 is a circuit diagram illustrating the latch circuit 830 illustrated in FIG. 8.

Referring to FIG. 9, the latch circuit 830 may include a plurality of switching circuits (SW1~SW9), a plurality of latch circuits (L1~L7), and an inverter IV4.

In this case, the switching circuits (SW1~SW3) of a first group may selectively receive plural cell data CDATA<0:7> according to a control signal of the refresh address RA<2>. For example, the switching circuits (SW1~SW3) of the first group may receive plural cell data CDATA<0:7> when the refresh address RA<2> is activated, and may store the received cell data in the latch circuits (L1~L3) of the first group. The latch circuits (L1~L3) of the first group may latch plural cell data CDATA<0:7> received from the switching circuits (SW1~SW3) of the first group, for a predetermined period of time.

The switching circuits (SW4~SW6) of a second group may arrange data stored in the latch circuits (L1~L3) of the first group according to a control signal of the pulse signal RA2FP, and may output the arranged data to the latch circuits (L4~L6) of the second group. For example, the switching circuits (SW4~SW6) of the second group may receive data from the latch circuits (L1~L3) of the first group when the pulse signal RA2FP is activated, and may store the received data in the latch circuits (L4~L6) of the second group. The latch circuits L4~L6 of the second group may latch data received from the switching circuits (SW4~SW6) of the second group, for a predetermined period of time.

The switching circuits (SW7~SW9) of a third group may selectively output data stored in the latch circuits (L4~L6) of the second group according to a control signal of the output signals P0<0:7>. For example, the switching circuits (SW7~SW9) of the third group may receive data from the latch circuits (L4~L6) of the second group when the output signals P0<0:7> are activated, and may output the received data to the latch circuit L7. The latch circuit L7 may latch data received from the switching circuits (SW7~SW9) of the third group, for a predetermined period of time. The inverter IV4 may sequentially output the cell data CD by inversion-driving data of the latch circuit L7.

The refresh control device according to an embodiment can reduce a refresh current by controlling a refresh period in different ways according to refresh characteristics of respective cells.

Figure 10:
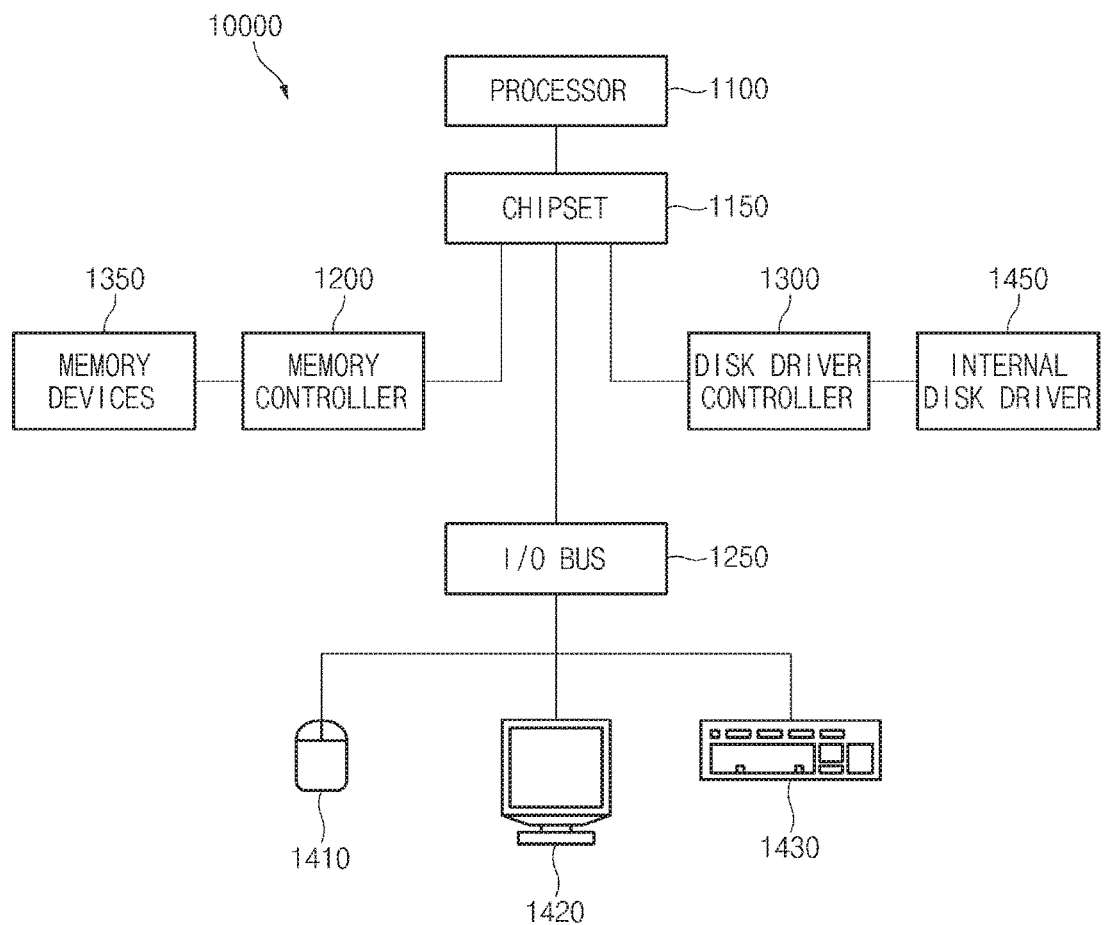
FIG. 10 illustrates a block diagram of an example of a representation of a system employing a refresh control device with the various embodiments discussed above with relation to FIGS. 1-9.

The refresh control devices as discussed above (see FIGS. 1-9) are particular useful in the design of memory devices, processors, and computer systems. For example, referring to FIG. 10, a block diagram of a system employing a refresh control device in accordance with the various embodiments are illustrated and generally designated by a reference numeral 10000. The system 10000 may include one or more processors (i.e., Processor) or, for example but not limited to, central processing units ("CPUs") 1100. The processor (i.e., CPU) 1100 may be used individually or in combination with other processors (i.e., CPUs). While the processor (i.e., CPU) 1100 will be referred to primarily in the singular, it will be understood by those skilled in the art that a system 10000 with any number of physical or logical processors (i.e., CPUs) may be implemented.

A chipset 1150 may be operably coupled to the processor (i.e., CPU) 1100. The chipset 1150 is a communication pathway for signals between the processor (i.e., CPU) 1100 and other components of the system 10000. Other components of the system 10000 may include a memory controller 1200, an input/output ("I/O") bus 1250, and a disk driver controller 1300. Depending on the configuration of the system 10000, any one of a number of different signals may be transmitted through the chipset 1150, and those skilled in the art will appreciate that the routing of the signals throughout the system 10000 can be readily adjusted without changing the underlying nature of the system 10000.

As stated above, the memory controller 1200 may be operably coupled to the chipset 1150. The memory controller 1200 may include at least one refresh control device as discussed above with reference to FIGS. 1-9. Thus, the memory controller 1200 can receive a request provided from the processor (i.e., CPU) 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one refresh control device as discussed above with relation to FIGS. 1-9, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420, and 1430. The I/O devices 1410, 1420, and 1430 may include, for example but are not limited to, a mouse 1410, a video display 1420, or a keyboard 1430. The I/O bus 1250 may employ any one of a number of communications protocols to communicate with the I/O devices 1410, 1420, and 1430. In an embodiment, the I/O bus 1250 may be integrated into the chipset 1150.

The disk driver controller 1300 may be operably coupled to the chipset 1150. The disk driver controller 1300 may serve as the communication pathway between the chipset 1150 and one internal disk driver 1450 or more than one internal disk driver 1450. The internal disk driver 1450 may facilitate disconnection of the external data storage devices by storing both instructions and data. The disk driver controller 1300 and the internal disk driver 1450 may communicate with each other or with the chipset 1150 using virtually any type of communication protocol, including, for example but not limited to, all of those mentioned above with regard to the I/O bus 1250.

It is important to note that the system 10000 described above in relation to FIG. 10 is merely one example of a refresh control device as discussed above with relation to FIGS. 1-9. In alternate embodiments, such as, for example but not limited to, cellular phones or digital cameras, the components may differ from the embodiments illustrated in FIG. 10.

Those skilled in the art will appreciate that the embodiments may be carried out in other specific ways than those set forth herein without departing from the spirit and essential characteristics of the disclosure. The above embodiments are therefore to be construed in all aspects as illustrative and not restrictive. The scope should be determined by the appended claims and their legal equivalents, not by the above description. Further, all changes coming within the meaning and equivalency range of the appended claims are intended to be embraced therein. In addition, it is obvious to those skilled in the art that claims that are not explicitly cited in each other in the appended claims may be presented in combination as an embodiment or included as a new claim by a subsequent amendment after the application is filed.

Although a number of illustrative embodiments have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. A refresh control device comprising:
    a fuse array configured to store fuse data corresponding to cell characteristic information;
    a refresh controller including unit cells and configured to store the fuse data received from the fuse array in each unit cell during a boot-up operation, and output weak cell information stored in a unit cell as two or more data based on a refresh address;
    a comparator configured to compare at least two data received from the refresh controller with each other, and output a comparison signal;
    a combination circuit configured to output a counting signal based on the comparison signal; and
    a refresh counter configured to count the counting signal such that the refresh address for controlling a refresh operation is output to the refresh controller.

2. The refresh control device according to claim 1, wherein the fuse array includes a fuse array group and a second fuse array group, each of which stores the weak cell information as fuse cutting information.

3. The refresh control device according to claim 2, wherein the first fuse array group and the second fuse array group include the same number of unit fuse cells.

4. The refresh control device according to claim 2, wherein:
    the number of word line units in which refreshing is performed is the same number of refresh units included in the first fuse array group and is the same number of refresh units in the second fuse array group.

5. The refresh control device according to claim 1, wherein:
    if each of the at least two data is set to data "0", the comparator determines a normal cell and outputs the comparison signal at a logic low level; and
    if each of the at least two data is set to data "1", the comparator determines a weak cell and outputs the comparison signal at a logic high level.

6. The refresh control device according to claim 1, wherein the refresh controller includes:
    a first cell array configured to store first fuse data of the fuse array, and output first data; and
    a second cell array configured to store second fuse data of the fuse array, and output second data.

7. The refresh control device according to claim 6, wherein the refresh controller includes:
    a first row decoder configured to select a row line of the first cell array by decoding the refresh address and the first fuse data;
    a second row decoder configured to select a row line of the second cell array by decoding the refresh address and the second fuse data;
    a first column decoder configured to select a column line of the first cell array by decoding the refresh address and the first fuse data; and
    a second column decoder configured to select a column line of the second cell array by decoding the refresh address and the second fuse data.

8. The refresh control device according to claim 6, wherein the first cell array and the second cell array include a plurality of unit cells arranged in row and column directions to store position information of each weak word line.

9. The refresh control device according to claim 8, wherein the first cell array and the second cell array are configured to sequentially output data stored in the plurality of unit cells.

10. The refresh control device according to claim 8, wherein each of the first cell array and the second cell array outputs data stored in the plurality of unit cells as one bit data.

11. The refresh control device according to claim 8, wherein:
    the first cell array is configured to store data indicating weak word line information in the plurality of unit cells arranged at odd lines; and
    the second cell array is configured to store data indicating weak word line information in the plurality of unit cells arranged at even lines.

12. The refresh control device according to claim 6, wherein:
    the refresh operation of a weak cell is additionally performed upon completion of the refresh operation of the first cell array; and
    the refresh operation of a weak cell is additionally performed upon completion of the refresh operation of the second cell array,
    wherein the refresh operation of the second cell array is performed upon completion of the refresh operation of the first cell array.

13. The refresh control device according to claim 1, wherein:
    if the comparison signal is first data, the refresh counter increases a count value such that the refresh operation corresponding to the count value is performed; and
    if the comparison signal is second data, the refresh counter increases the count value upon completion of the refresh operation corresponding to the corresponding count value.

14. The refresh control device according to claim 1, wherein the comparator selects any one of a first signal obtained when first data is compared with a rising pulse signal with a second signal obtained when second data is compared with a falling pulse signal, and outputs the selected one as the comparison signal.

15. The refresh control device according to claim 1,
    wherein the combination circuit is configured to output the counting signal based on the comparison signal and a refresh control signal, and
    wherein the refresh control device further comprises:
    a pulse generator configured to generate the refresh control signal by detecting a falling edge of an internal refresh command signal;

a delay circuit configured to delay an output signal of the refresh counter;

a rising edge detector configured to generate a rising pulse signal by detecting a rising edge of the output signal of the delay circuit;

a falling edge detector configured to generate a falling pulse signal by detecting a falling edge of the output signal of the delay circuit; and an adder configured to add output addresses of the refresh counter, and thus output the added result to the refresh controller.

16. The refresh control device according to claim 1, wherein:

if the combination circuit receives at least one of either the comparison signal, activated, or a refresh control signal, activated, the combination circuit is configured to activate the counting signal.

17. The refresh control device according to claim 1, wherein the refresh controller is located in a peripheral region of a semiconductor device.

18. The refresh control device according to claim 1, further comprising:

a data controller configured to latch plural data received from the refresh controller, and sequentially output the latched data to the comparator based on an output signal.

19. The refresh control device according to claim 18, wherein the data controller includes:

a decoder configured to decode the refresh address;

a noise eliminator configured to remove noise from an output signal of the decoder; and a latch circuit configured to latch plural cell data received from the refresh controller, and sequentially output the latched cell data based on the output signal.

20. A refresh control device comprising:

a fuse array configured to store fuse data corresponding to cell characteristic information;

a refresh controller including a first cell array and a second cell array, the first and second cell arrays including unit cells and the refresh controller configured to store position information of a word line having weak cell characteristics based on fuse data;

a comparator configured to receive a first data from the first cell array including weak word line information of a selected cell and to receive a second data from the second cell array including weak word line information of a selected cell;

wherein the comparator compares the first data with the second data to determine the presence of a weak word line such that a refresh operation on the corresponding cell is performed.

21. The refresh control device according to claim 20, wherein the comparator compares the first data with the second data to determine the presence of a normal word line such that a refresh operation on the corresponding cell is skipped.

22. The refresh control device according to claim 20, wherein the refresh controller is configured to output the first and second data including the weak word line information of the selected cells to the comparator based on a refresh address.

23. The refresh control device according to claim 20, wherein the fuse data is transferred to the first and second cell arrays and is stored in the unit cells located at corresponding positions in the fuse array.

24. The refresh control device according to claim 20, wherein the first data corresponds to bit data and the second data corresponds to bit data.

* * * * *